(12) United States Patent
Windprechtinger et al.

(10) Patent No.: US 10,400,613 B2
(45) Date of Patent: Sep. 3, 2019

(54) METHOD OF PRODUCING BLADES OR BLADE ARRANGEMENTS OF A TURBOMACHINE WITH EROSION PROTECTION LAYERS AND CORRESPONDINGLY PRODUCED COMPONENT

(71) Applicant: MTU Aero Engines AG, Munich (DE)

(72) Inventors: Joerg Windprechtinger, Munich (DE); Ralf Stolle, Wolfratshausen (DE); Philipp Utz, Karlsfeld (DE); Thomas Uihlein, Dachau (DE); Markus Gether, Hettenshausen (DE)

(73) Assignee: MTU AERO ENGINES AG, Munich (DE)

( * ) Notice: Subject to any disclaimer, the term of this patent is extended or adjusted under 35 U.S.C. 154(b) by 83 days.

(21) Appl. No.: 15/599,567

(22) Filed: May 19, 2017

(65) Prior Publication Data
US 2017/0335697 A1 Nov. 23, 2017

(30) Foreign Application Priority Data
May 20, 2016 (EP) .................................... 16170521

(51) Int. Cl.
*F01D 5/28* (2006.01)
*C23C 28/02* (2006.01)
(Continued)

(52) U.S. Cl.
CPC ............ *F01D 5/288* (2013.01); *C23C 14/024* (2013.01); *C23C 14/028* (2013.01); *C23C 14/0641* (2013.01); *C23C 14/5886* (2013.01); *C23C 28/02* (2013.01); *C23C 28/321* (2013.01); *C23C 28/34* (2013.01); *C23C 28/36* (2013.01);
(Continued)

(58) Field of Classification Search
None
See application file for complete search history.

(56) References Cited

U.S. PATENT DOCUMENTS 7,186,092 B2 3/2007 Bruce et al.
7,927,709 B2 4/2011 Eichmann et al.
(Continued)

FOREIGN PATENT DOCUMENTS

DE 102004017646 A1 10/2005
DE 102007050918 A1 4/2008
(Continued)

*Primary Examiner* — Shamim Ahmed
*Assistant Examiner* — Bradford M Gates
(74) *Attorney, Agent, or Firm* — Abel Schillinger, LLP

(57) ABSTRACT

The present invention relates to a method for producing a blade or blade arrangement of a turbomachine, which features the following steps:
 producing a blade (4) from at least one blade material,
 machining the blade in at least one region of the blade by a surface machining process,
 cleaning the surface of the blade
 depositing an erosion protection coating (10) of at least two layers of different hardness by physical vapor deposition in the at least one region,
 machining the erosion protection coating (10) by a coating smoothing process in order to establish a defined surface roughness.

Furthermore, the invention relates to correspondingly produced blades or blade arrangements.

20 Claims, 4 Drawing Sheets

(51) Int. Cl.
*C23C 28/00* (2006.01)
*C23C 14/02* (2006.01)
*C23C 14/06* (2006.01)
*C23C 14/58* (2006.01)
C23C 14/16 (2006.01)
C23C 14/22 (2006.01)

(52) U.S. Cl.
CPC ............ *C23C 28/42* (2013.01); *C23C 28/44* (2013.01); *C23C 14/165* (2013.01); *C23C 14/228* (2013.01); *F05D 2230/313* (2013.01); *F05D 2250/621* (2013.01); *F05D 2300/132* (2013.01); *F05D 2300/17* (2013.01); *F05D 2300/506* (2013.01); *F05D 2300/611* (2013.01); *Y02T 50/672* (2013.01)

(56) References Cited

U.S. PATENT DOCUMENTS

| | | |
|---|---|---|
| 7,942,638 B2 | 5/2011 | Eichmann et al. |
| 8,088,501 B2 | 1/2012 | Endrino |
| 8,118,561 B2 | 2/2012 | Bruce et al. |
| 8,196,600 B1 | 6/2012 | Bruce et al. |
| 8,663,814 B2 | 3/2014 | Eichmann et al. |
| 2002/0148328 A1* | 10/2002 | Holz ............... C04B 41/5037 75/528 |
| 2006/0018760 A1 | 1/2006 | Bruce et al. |
| 2006/0078432 A1* | 4/2006 | Darolia ............ C23C 14/027 416/241 R |
| 2007/0190351 A1 | 8/2007 | Eichmann et al. |
| 2008/0102296 A1 | 5/2008 | Ghasripoor et al. |
| 2009/0011195 A1 | 1/2009 | Bruce et al. |
| 2010/0078308 A1 | 4/2010 | Bruce et al. |
| 2010/0086397 A1 | 4/2010 | Varanasi et al. |
| 2010/0226782 A1 | 9/2010 | Eichmann et al. |
| 2011/0045264 A1 | 2/2011 | Heutling et al. |
| 2011/0091701 A1 | 4/2011 | Endrino |
| 2012/0160348 A1* | 6/2012 | Bruce ............... C23C 14/0641 137/527 |
| 2012/0141822 A1 | 7/2012 | Eichmann et al. |

FOREIGN PATENT DOCUMENTS

| | | |
|---|---|---|
| DE | 102007027335 A1 | 12/2008 |
| DE | 102008019891 A1 | 10/2009 |
| DE | 112009002430 T5 | 9/2011 |
| DE | 112009002080 B4 | 2/2016 |
| EP | 1741876 A1 | 1/2007 |
| EP | 2172577 A2 | 4/2010 |
| EP | 2468916 A1 | 6/2012 |
| WO | 2005066384 A1 | 7/2005 |

* cited by examiner

METHOD OF PRODUCING BLADES OR BLADE ARRANGEMENTS OF A TURBOMACHINE WITH EROSION PROTECTION LAYERS AND CORRESPONDINGLY PRODUCED COMPONENT

BACKGROUND OF THE INVENTION

Field of the Invention

The present invention relates to a method for producing a blade or blade arrangement for a turbomachine and also to a blade, especially to a blisk, for a turbomachine, which has been produced by means of the method.

Discussion of Background Information

Turbomachines, such as stationary gas turbines or aviation engines, have inter alia a multiplicity of blades which are rotatably arranged on a rotor in order to either compress the fluid which flows through the turbomachine or to be rotatably driven by the fluid.

In order to minimize the flow losses between the rotating blades and an encompassing flow passage boundary, the gap between the blade tips at the radial end of the blades and the flow passage boundary has to be as small as possible so that as little as possible fluid can flow through the gap between flow passage boundary and blades. However, in the case of the design of a gap which is excessively small contact can occur between the blade tips and an encompassing flow passage boundary so that for example when using titanium materials for the blades and the flow passage boundary the development of so-called titanium fires can occur with corresponding damage to the blades.

For avoiding flow losses, in known turbomachines for sealing between the blade tips and the flow passage boundary provision is made for so-called labyrinth seals in which the blade tips move in a groove which during operation of the turbomachine is formed in a sealing material on the flow passage boundary as a result of corresponding cutting in of the blade tips. Accordingly, it is also known to provide so-called blade-tip armor platings on the blade tips which for example have hard material particles embedded in a metal matrix in order to cut the groove for the labyrinth seal in the opposite sealing material of the flow passage boundary by means of the hard material particles and to protect the blade tip against wear.

Furthermore, blades of turbomachines additionally comprise protective coatings, such as erosion protection coatings, on the blade airfoil in order to also protect the blade material in the region of the blade airfoil against wear, for example as a result of erosion.

From unexamined German applications DE 10 2007 027 335 A1 and DE 10 2008 019 891 A1 and also international PCT application WO 2005/066 384 A1 different wear protection coatings or erosion protection coatings for components of turbomachines are known.

Due to the various loads of blade tips, blade airfoils or generally different regions of a blade, it is necessary to arrange different coatings on a blade for a turbomachine, such as tip armor plating on the blade tips and an erosion protection coating on the blade airfoil, wherein it has to be ensured, however, that the coatings can fulfill their desired function as optimally as possible.

Consequently, a difficulty exists in depositing suitable coatings in the correct manner in order to bring out the optimum properties of the coatings. This applies to individual blades which after finishing can be arranged as stationary blades in a flow passage or as rotating blades on a rotor disk, but also to a specific degree to bladed disks, so-called blisks (blade integrated disk or integrally bladed rotor), in which on account of the complex structure a corresponding coating of the blades is even more difficult to perform.

SUMMARY OF THE INVENTION

The present invention has therefore the object of providing a method for producing a blade or blade arrangement of a turbomachine and particularly a blade arrangement such as a blisk, and also correspondingly produced blades or blisks, which have a balanced characteristic profile with regard to erosion protection of the blade airfoils and protection of the blade tips, especially for avoiding the so-called titanium fires. At the same time, the method is to be implementable in a simple manner and the correspondingly produced components are to enable a reliable and durable operation of the turbomachine.

This object is achieved by a method and also by a blade, especially a blisk, as set forth in the independent claims. Advantageous embodiments are the subject matter of the dependent claims.

The invention proposes a method in which a blade or blade arrangement for a turbomachine, such as a blisk, is first of all produced from at least one blade material.

The blade or blade arrangement is machined in at least one region of the blade by means of a surface machining method in order to prepare the surface for the subsequent deposition of an erosion protection coating.

After the surface machining, the surface of the blade is cleaned and then an erosion protection coating of at least two layers of different hardness is deposited by physical vapor deposition (PVD) in the at least one region of the blade surface prepared by surface machining.

After deposition of the erosion protection coating, the surface of the erosion protection coating is smoothed by means of a coating smoothing process in order to establish a smooth surface which has a smoothness which is better than a predetermined surface roughness. The surface quality can for example be defined by an average roughness $R_a$ which indicates the average distance of a measurement point on the surface to the center line, wherein the center line along the reference length or measurement length intersects the surface profile so that the sum of the profile deviations with regard to the center line becomes minimal. The average roughness $R_a$ can for example be predetermined to be less than or equal to 0.5 µm, especially less than or equal to 0.25 µm. In particular, the surface quality with an average roughness $R_a$ which is less than or equal 0.25 µm along a measurement length on the blade is to be parallel to the flow direction of the fluid of a turbomachine. As a result, the smoothing expenditure transversely to the flow direction can be reduced and at the same time the effect of the coating thickness of the applied erosion protection coating being unnecessarily reduced as a result of smoothing is prevented. Consequently, the service life of the coating and of the coated component can also be increased.

The material of the blade or of a blisk can be a titanium alloy, a nickel alloy, steel and also a composite material, especially a ceramic-matrix composite material, wherein alloys of which the main constituent is nickel or titanium are to be understood by titanium alloy and nickel alloy. A corresponding blade or a blisk can be formed from a plurality of materials, for example from different materials for the blade airfoil and for the blade root or the disk.

The surface machining process, by means of which at least one region of the blade is machined before deposition of the erosion protection coating, can be at least one process from the group which comprises grinding, slide grinding, polishing, electropolishing, shot peening and shot blasting. As a result of the grinding and polishing, a surface which is as smooth as possible and favorable for the adhesion of the subsequent coating can be established, wherein the smooth forming of the surface of the base material of the blade or of the blisk also ensures that the surface of the subsequently deposited erosion protection coating achieves a defined surface quality with regard to roughness. As a result of shot peening and especially shot blasting of the surface before application of the coating, the fatigue strength of the blades, especially in the case of blades of titanium alloys, can be improved.

After the surface machining of the blade, the blade is cleaned and the erosion protection coating is then applied by physical vapor deposition (PVD), especially sputtering (cathode evaporation) or cathodic arc deposition. The erosion protection coating can consist of a multilayer coating system with one or more repeating sequences of a plurality of layers, wherein the layers can be formed by metal layers, metal alloy layers, ceramic layers, metal-ceramic layers and graded metal-ceramic layers. In particular, the layers of the multi-layer coating system can be selected so that each sequence of a plurality of layers has at least one hard layer and at least one soft layer, wherein the hardness of the layer is determined by the relative relationship to the other layer(s), that is to say the property hard is used in the sense that this layer is harder than at least one other layer of the multilayer coating system or of the layer sequence, whereas a soft layer correspondingly constitutes a layer which is softer in comparison to the other layers.

In particular, the multilayer coating system can be constructed so that hard and soft layers are provided in an alternating manner. For example, a metal layer can be provided as a soft layer and a ceramic layer can be provided as a hard layer. Furthermore, between the soft layer, for example a metal layer, and a hard layer, for example a ceramic layer, provision can be made for additional intermediate layers which can have different degrees of hardness, such as a metal alloy layer and a graded metal-ceramic layer, in which the metal constituent, starting from an adjacently arranged metal layer or metal alloy layer, decreases toward a ceramic layer which is arranged on the other side. Preferably, a sequence of layers, which can be repeated several times in the multilayer coating system, can comprise a metal layer, a metal alloy layer, a preferably graded metal-ceramic layer and a ceramic layer.

A sequence of layers can have a thickness of up to 50 µm. Each individual layer of a sequence of layers or of a multilayer coating system can have a thickness of between 0.2 µm and 10 µm.

Individual layers of the multilayer coating system or of a layer sequence can themselves be nanostructured again and have a plurality of sub-layers, especially alternately repeating sub-layers, of which each sub-layer can have a thickness of between 10 nm and 200 nm.

A hard layer, especially the hardest layer, in a multilayer coating system or in a layer sequence can preferably be formed as a nanostructured layer with a plurality of alternately repeating sub-layers.

The layers can be formed on a chromium base and correspondingly comprise layers of chromium, chromium alloys, CrAlN layers and CrN layers, wherein the chromium alloy can be a Cr—Ni alloy. The ceramic layer, which in a layer sequence or in a multilayer coating system can constitute a hard layer, can have alternately repeating CrAlN layers and CrN layers as sub-layers.

Before deposition of the erosion protection coating with the corresponding layers or sub-layers, a diffusion barrier layer and/or an adhesion promoting layer can additionally be deposited between the base material and the erosion protection coating. Such layers can also be formed from CrAlN.

For smoothing the erosion protection coating, the erosion protection coating can be ground or polished and be machined especially by slide grinding and/or electropolishing in order to achieve the necessary surface quality with regard to roughness.

Before or after the smoothing of the erosion protection coating by means of a coating smoothing process, the surface can also be treated by shot peening, especially shot blasting, in order to compress the edge region.

After the machining of the blade by means of a surface machining process and before deposition of an erosion protection coating, a cutting of the blade to the desired blade length and/or the deposition of a tip armor plating can be carried out, particularly in the case of blisks, so that the erosion protection coating can be deposited over the blade tip or the blade-tip armor plating. As a result of deposition of the additional erosion protection coating in the region of the blade tip or the blade-tip armor plating, an additional protection of the blade tip or the blade-tip armor plating is effected.

After the coating smoothing process or strengthening by a blasting treatment, a blade or a blisk is finished off, wherein if required still further additional functional coatings can be deposited on the erosion protection coating or the remaining component.

The erosion protection coating, in the case of partial application, can be deposited on the blade with decreasing layer thickness toward the edges of the erosion protection coating so that a continuous transition of the erosion protection coating from an uncoated region of the blade to a coated region of the blade ensues without forming edges or the like. Similarly, a continuous transition between thicker regions of the erosion protection coating to less thick regions of the erosion protection coating and vice versa can also be carried out. The coating thickness of the erosion protection coating can for example vary to the effect that a coating thickness of the erosion protection coating which is different to the blade airfoil surface is deposited on the flow leading edge and/or the flow trailing edge of the blade. For example, the erosion protection coating can be deposited on the leading edge and/or trailing edge of the blade with a thickness of between 20% and 200% of the coating thickness on the blade airfoil.

BRIEF DESCRIPTION OF THE DRAWINGS

In the attached drawings, in a purely schematic manner

EXEMPLARY EMBODIMENTS

Further advantages, characteristics and features of the present invention become clear in the subsequent detailed description of exemplary embodiments. However, the invention is not limited to these exemplary embodiments.

Figure 1:
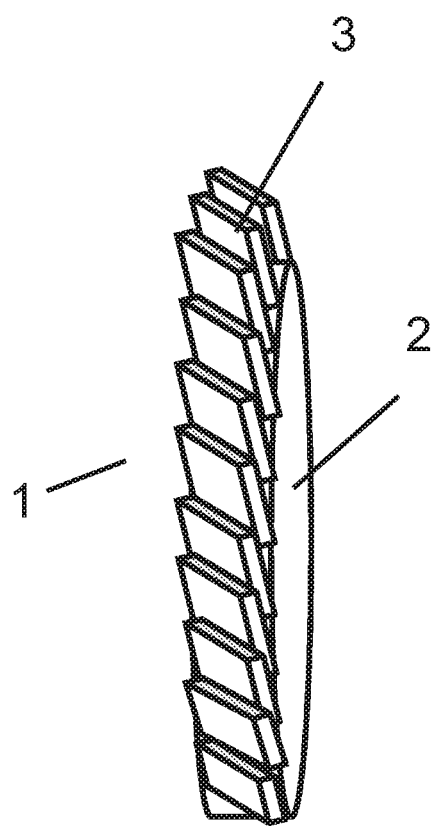
FIG. 1 shows a perspective view of a first exemplary embodiment of blades produced according to the invention in the form of a bladed disk (blisk)

FIG. 1 shows a perspective view of a so-called blisk 1 (blade integrated disk or integrally bladed rotor) which features a disk 2 and a multiplicity of blades 3 which are arranged integrally therein. The depicted blisk 1 is a single-row blisk 1 in which only one encompassing row of blades 3 is provided. However, blisk drums (not shown), in which a plurality of blade rows are provided next to each other on one or more integrally interconnected disks, can also be used. For example, such blisk drums can be created as a result of the axial welding of a plurality of blisks 1, as are shown in FIG. 1. Such blisk drums can also be produced by means of the method according to the invention.

Figure 2:
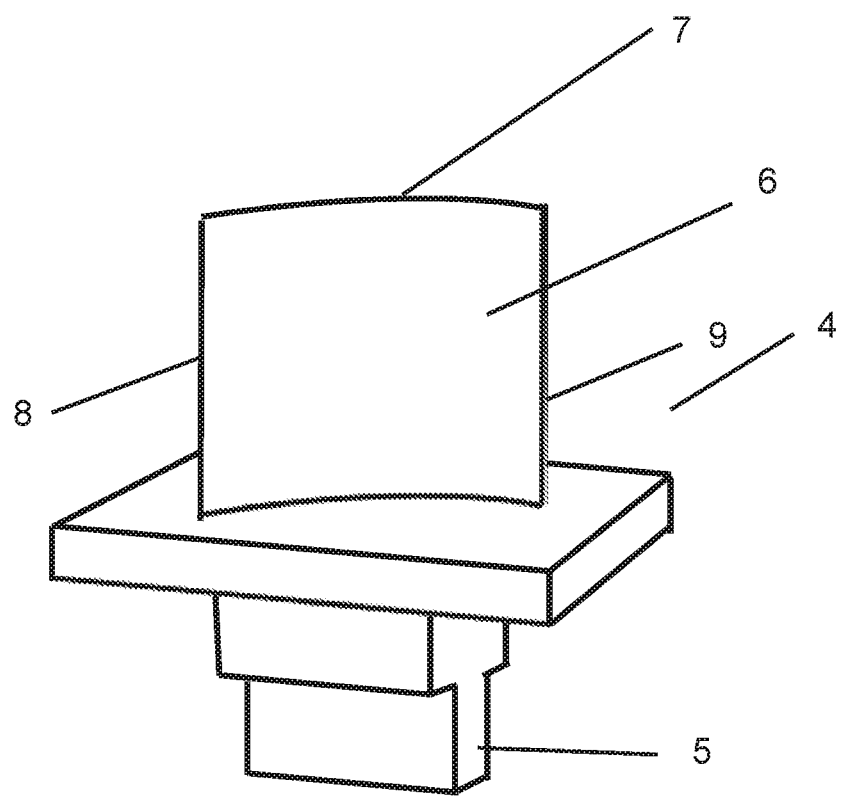
FIG. 2 shows a perspective view of a second exemplary embodiment of a blade produced according to the invention, as can be used in turbomachines.

FIG. 2 shows in a purely schematic manner a perspective view of a blade, as can be used in a turbomachine, such as a stationary gas turbine or an aviation engine. The blade 4 has a blade root 5 which can be installed in a disk which rotates with a shaft of the turbomachine. The blade furthermore has a blade airfoil 6 which is arranged in the flow passage of the turbomachine and either compresses the fluid which flows through the turbomachine or is driven by the fluid flowing past. Located at the radially outer end of the blade 4 is the so-called blade tip 7 which for avoiding flow losses butts as tightly as possible against an encompassing flow passage housing or even cuts into this. To this end, provision is made on the blade tip 7 for a blade-tip armor plating (see FIG. 3) which also has a cutting function so that the blade tip 7 can cut into an encompassing flow passage housing or sealing material which is arranged thereon. For example, the blade-tip armor plating can be formed by a coating with a nickel matrix with embedded cubic boron nitride particles.

For protection of the blade 4, the blade airfoil 6 also has a coating, specifically an erosion protection coating 10, which is intended to protect the material of the blade 4 against erosive wear. Such an erosion protection coating 10 can consist of a so-called multilayer coating or multiple layered coating, which can consist of a multiplicity of alternately deposited hard and soft layers, particularly ceramic layers and metal layers. The erosion protection coating 10 can be deposited in the main on the blade airfoil 6 and also on the leading edge 8 and the trailing edge 9 of the blade, but also on the blade tip 7, e.g. over a blade-tip armor plating (not shown).

Figure 3:
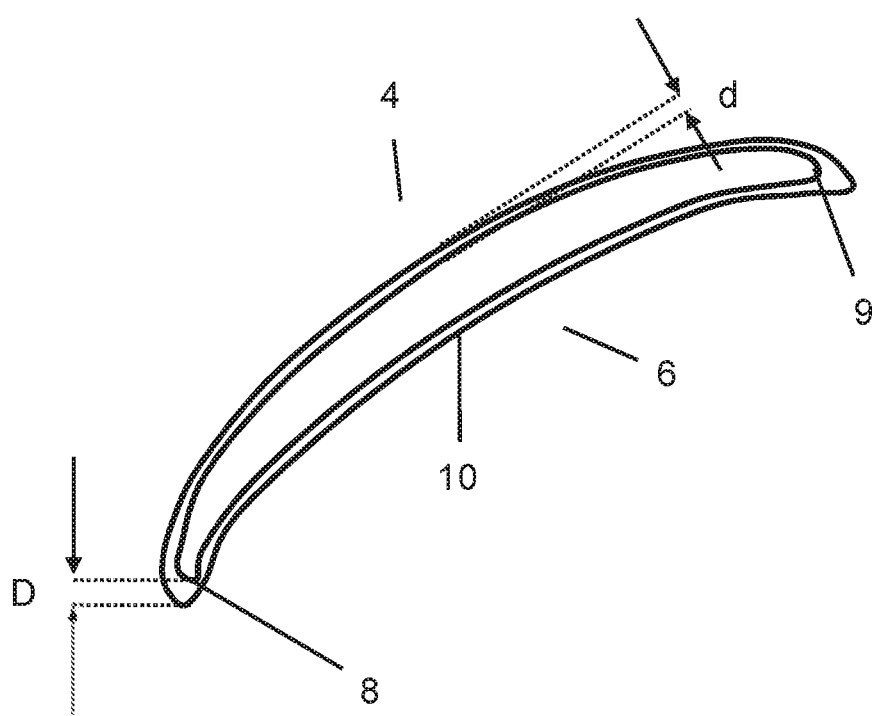
FIG. 3 shows a sectional view through the blade airfoil of the blade according to FIG. 2

It is to be gathered from FIG. 3 that the erosion protection coating can be deposited with different coating thickness on the blade 4 or on the blade airfoil 6. Therefore, for example the coating thickness D of the erosion protection coating 10 on the flow leading edge 8 can have up to 200% of the coating thickness d of the erosion protection coating 10 on the blade airfoil surface. Furthermore to be gathered from FIG. 3 is that the coating thickness of the erosion protection coating 10 can alter continuously so that there is no abrupt transition or an edge between the erosion protection coating 10 on the blade airfoil surface and the erosion protection coating 10 on the leading edge 8 or the trailing edge 9. In the embodiment of FIG. 3, the erosion protection coating 10 in cross section is arranged around the entire blade airfoil 6, wherein the erosion protection coating 10 can also be only partially applied to the blade airfoil 6, however, for example only on the pressure side and not on the suction side of the blade 4, wherein at the corresponding limits, on which the erosion protection coating 10 runs out, a correspondingly continuous transition can again be provided so that termination edges, which could lead to unfavorable stress ratios and to crack development, are dispensed with.

Figure 4:
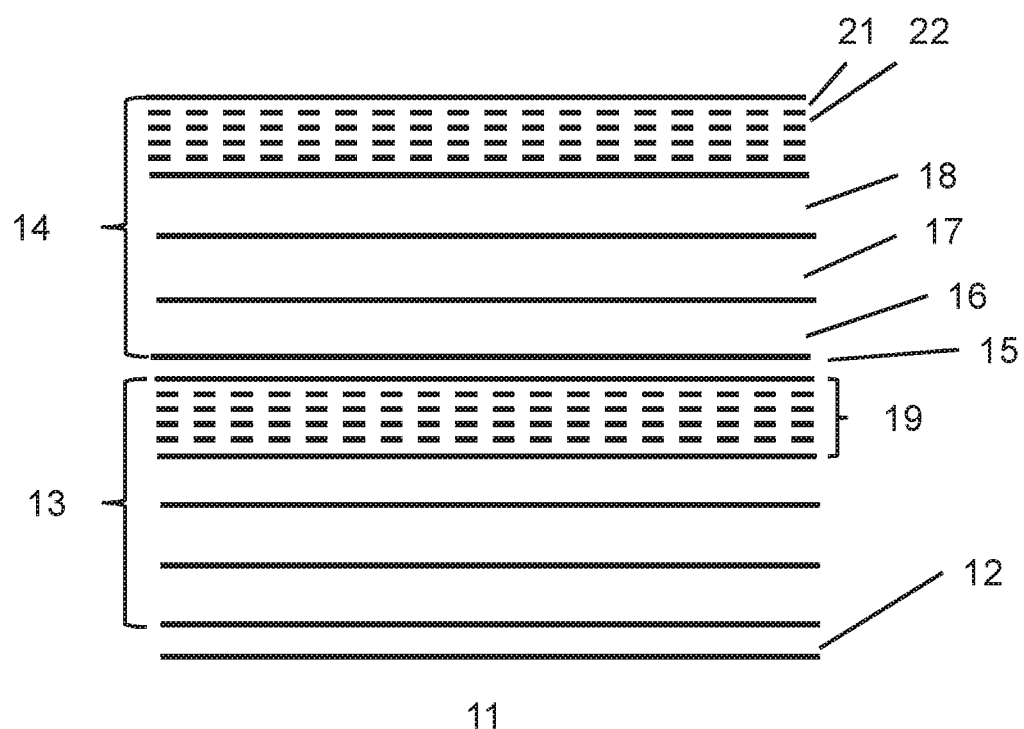
FIG. 4 shows a sectional view through the coating construction of an erosion protection coating deposited according to the invention.

FIG. 4 shows a partial cross section through an erosion protection coating according to the invention, as for example can be applied to the blades 3 of the blisk 1 or to the blade airfoil 6 of the blade 4.

In the depicted exemplary embodiment of FIG. 4, an adhesion promoting layer 12, on which the actual erosion protection coating 10 is arranged, is first of all arranged on the base material 11 of the blade 3 or 4 which can be formed from a titanium alloy, a nickel alloy, steel, a composite material or a ceramic-matrix composite material or another suitable base material. The adhesion promoting layer 12 can be formed from a ceramic material, especially a gradient material which starting from the boundary surface on the base material 11 has an ever decreasing proportion of the base material. For example, the adhesion promoting layer 12 can be formed from graded CrN, wherein the CrN layer also serves at the same time as a diffusion barrier layer.

Two identical layer sequences 13 and 14 with the respective layers 16, 17, 18, 19, which in turn are separated from each other by a diffusion barrier layer 15, preferably consisting of CrN, are applied on top of the adhesion promoting layer or the diffusion barrier layer 12.

In the case of the individual layers of the layer sequences 13, 14 it is a metal layer 16, a metal alloy layer 17, a metal-ceramic gradient layer 18 and a nanostructured ceramic layer 19, which in turn are formed from a plurality of alternately provided ceramic sub-layers 21, 22.

The metal layer 16 is formed for example as a chromium layer in the depicted exemplary embodiment, whereas the metal alloy layer 17 is a Cr—Ni layer. In the case of the metal-ceramic gradient layer 18, it is a $Cr_xAl_xN$ layer in the exemplary embodiment, whereas the nanostructured ceramic layer 19 consisting of ceramic sub-layers 21, 22 is formed from CrAlN and CrN.

In the case of the nanostructured ceramic layer 19, the sub-layers 21, 22 can be formed with layer thicknesses within the range of between 10 mm and 200 mm, whereas the layer thicknesses of the layers 16, 17, 18, 19 of the layer sequences 13, 14 can lie within the range of between 0.2 μm and 10 μm. The individual layers are deposited by means of physical vapor deposition (PVD) and especially by means of cathode evaporation (sputtering) or by means of cathodic arc deposition (CatArc).

After deposition of the layers, the uppermost layer is smoothed by means of grinding or polishing and the applied erosion protection coating 10 can be strengthened by shot blasting before or after the smoothing of the surface.

Although the present invention has been clearly described by the exemplary embodiments, it is self-evident that the invention is not limited to these exemplary embodiments but rather that modifications are possible in a way that individual features can be omitted or other types of combinations of features can be realized providing the extent of protection of the attached claims is not abandoned. The present disclosure includes all combinations of the presented individual features.

LIST OF REFERENCE NUMERALS

1 Blisk
2 Disk
3 Blade
4 Blade
5 Blade root
6 Blade airfoil
7 Blade tip
8 Leading edge
9 Trailing edge
10 Erosion protection coating
11 Base material
12 Adhesion promoting layer or diffusion barrier layer
13 Layer sequence
14 Layer sequence
15 Diffusion barrier layer
16 Metal layer
17 Metal alloy layer
18 Metal-ceramic gradient layer
19 Nanostructured ceramic layer
21 Ceramic sub-layer
22 Ceramic sub-layer

What is claimed is:

1. A method for producing a blade or blade arrangement of a turbomachine, wherein the method comprises:
    subjecting a blade made of at least one blade material to a surface machining process in at least one region of the blade;
    cleaning the surface of the blade which has been subjected to the surface machining process in the at least one region;
    depositing on the at least one region of the blade which has been cleaned an erosion protection coating comprising at least two layers of different hardness by physical vapor deposition; and
    machining the deposited erosion protection coating by a coating smoothing process.

2. The method of claim 1, wherein the blade is a part of a blisk.

3. The method of claim 1, wherein the at least one blade material is selected from one or more of titanium alloys, nickel alloys, steel, composite materials, ceramic-matrix composite materials.

4. The method of claim 1, wherein the surface machining process is selected from one or more of grinding, slide grinding, polishing, electropolishing, shot peening, shot blasting.

5. The method of claim 1, wherein the erosion protection coating comprises a sequence of layers which are selected from one or more of metal layers, metal alloy layers, ceramic layers, metal-ceramic layers, graded metal-ceramic layers.

6. The method of claim 5, wherein the sequence of layers has a total thickness of less than 50 μm and/or each layer of the sequence of layers has a thickness of from 0.2 μm to 10 μm.

7. The method of claim 5, wherein the sequence of layers comprises a layer which is nanostructured and deposited in a plurality of sub-layers.

8. The method of claim 7, wherein the plurality of sub-layers is a plurality of alternately repeating sub-layers of which an individual sub-layer has a thickness of from 10 nm to 200 nm.

9. The method of claim 5, wherein the layers of the sequence of layers comprise layers of one or more of chromium, chromium alloys, CrAlN, CrN.

10. The method of claim 1, wherein prior to deposition of the erosion protection coating a diffusion barrier layer and/or an adhesion promoting layer is deposited.

11. The method of claim 1, wherein the coating smoothing process comprises at least one of grinding, slide grinding, polishing, electropolishing.

12. The method of claim 1, wherein before or after the coating smoothing process, shot peening is carried out.

13. The method of claim 1, wherein after the machining of the blade by a surface machining process and prior to deposition of the erosion protection coating a deposition of a tip armor plating is carried out.

14. The method of claim 13, wherein the blade-tip armor plating comprises a nickel matrix with embedded cubic boron nitride particles.

15. The method of claim 1, wherein after the coating smoothing process one or more functional layers are applied.

16. The method of claim 1, wherein the erosion protection coating is deposited on the blade as partial coating with decreasing layer thickness toward edges of the erosion protection coating and/or is deposited on a flow leading edge and/or flow trailing edge of the blade with a different layer thickness compared to that on a blade airfoil.

17. The method of claim 16, wherein the erosion protection coating is deposited on a flow leading edge and/or flow trailing edge of the blade with a thickness of from 20% to 200% of a layer thickness on the blade airfoil.

18. The method of claim 16, wherein the erosion protection coating is deposited on a flow leading edge and/or flow trailing edge of the blade with a continuous transition from the blade airfoil to the flow leading edge or trailing edge.

19. The method of claim 1, wherein after the machining of the blade by a surface machining process and prior to deposition of the erosion protection coating a cutting of the blade to length is carried out.

20. A blade or blade arrangement of a turbomachine, produced by the method of claim 1.

* * * * *